United States Patent [19]

Ströbel et al.

[11] Patent Number: 4,633,178

[45] Date of Patent: Dec. 30, 1986

[54] PROCESS FOR THE EXCITATION OF A SAMPLE FOR NMR TOMOGRAPHY

[75] Inventors: Bernhard Ströbel, Waldbronn; Dieter Ratzel, Rheinstetten, both of Fed. Rep. of Germany

[73] Assignee: Bruker Medizintechnik GmbH, Rheinstetten-Forchheim, Fed. Rep. of Germany

[21] Appl. No.: 723,807

[22] Filed: Apr. 16, 1985

[30] Foreign Application Priority Data

Apr. 18, 1984 [DE] Fed. Rep. of Germany ....... 3414635

[51] Int. Cl.$^4$ ............................................ G01R 33/20
[52] U.S. Cl. ..................................... 324/309; 324/314
[58] Field of Search ............... 324/307, 309, 314, 300, 324/312; 128/653

[56] References Cited

U.S. PATENT DOCUMENTS

| | | | |
|---|---|---|---|
| 4,115,730 | 9/1978 | Mansfield | 324/309 |
| 4,471,305 | 9/1984 | Crooks et al. | 324/314 |
| 4,521,733 | 6/1985 | Bottomley et al. | 324/307 |
| 4,536,712 | 8/1985 | Iwaoka et al. | 324/309 |

FOREIGN PATENT DOCUMENTS 0088970 3/1983 European Pat. Off. .
2936465 11/1981 Fed. Rep. of Germany .

OTHER PUBLICATIONS

Accurate T2 NMR Images; Med. Phys., 10 (5), Sep.-/Oct. 1983, Nicholas J. Schneiders.
Experimental Pulse NMR; Eiichi Fukushima & Stephen B. W. Roeder; Addison-Wesley Publishing Co. Inc, 1981, pp. 25-35.

Primary Examiner—Stewart J. Levy
Assistant Examiner—Kevin D. O'Shea
Attorney, Agent, or Firm—Kokjer, Kircher, Bradley, Wharton, Bowman & Johnson

[57] ABSTRACT

The use of longer 180° pulse sequences for the generation of spin echos is made possible according to the invention during NMR tomography using the 2d-Fourier transformation process in that the phase position and, thus, the sense of rotation of the 180° pulses is reversed after every two pulses. The mirror images which appear otherwise when using the known 180° pulse sequences, e.g. the Carr-Purcell-Gill-Meiboom pulse sequence, are avoided by this measure.

1 Claim, 12 Drawing Figures

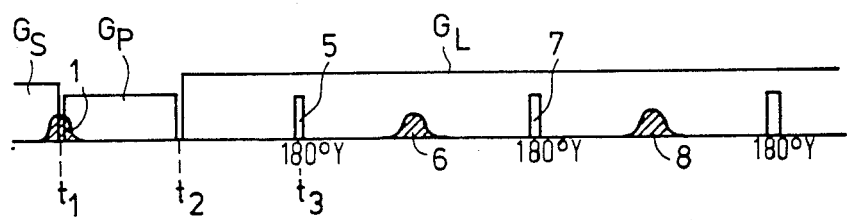
Fig.1
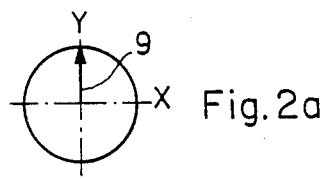
Fig. 2a
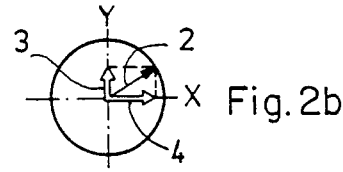
Fig. 2b
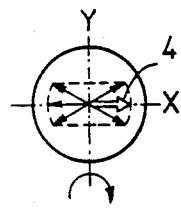 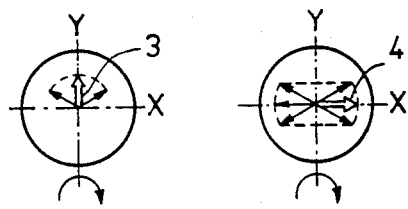
Fig. 2c   Fig. 2d

PROCESS FOR THE EXCITATION OF A SAMPLE FOR NMR TOMOGRAPHY

The present invention relates to a process for the excitation of a sample for NMR tomography, wherein the sample is exposed to a homogenous magnetic field and in addition to a selection gradient, and is excited by a 90° selection pulse, whereafter the selection gradient is replaced by a time-restricted phase coding gradient and a read gradient, the selection gradient, phase coding gradient, and read gradient being perpendicular to each other respectively in pairs, and wherein lastly the sample, after the end of the phase coding gradient, is irradiated during the prevailing read gradient with a sequence of 180° pulses, whereby measurable core induction signals in the form of the so-called spin echos are generated.

The generation and measurement of core resonance signals after the influencing of the sample by a time-restricted phase coding gradient which is supplied before switching on the read gradient leads by the use of a two-dimensional Fourier transformation to the generation of cross-sectional images, for which reason this process is also named 2DFT. As was stated above, it is conceivable in principle to use for the generation of core induction signals the spin echo pulse sequences which are generally employed in NMR spectrometry, such as particularly the Carr-Purcell pulse sequence or the Carr-Purcell-Gill-Meiboom pulse sequence. These pulse sequences, after common excitation, make possible the generation of a plurality of echo signals which can be added up to improve the signal-noise ratio or can be used to determine the spin-spin relaxation time $T_2$. But it has been found that when employing the 2DFT method the previously known pulse sequences are only usable to a limited extent, since with the growing number of echos, artefacts in the form of images appear to an increasing extent, which are reflected with respect to the undisturbed image on an axis which is parallel to the direction of the read gradient. Such artefacts will hereinafter be named mirror images.

Since on the other hand for example the exact determination of $T_2$ or an analysis according to various $T_2$ contributions during a multi-exponential spin-spin relaxation is only practicable with the aid of many spin echos, the 2DFT process could not previously be used for such investigations which are of great significance in diagnostic medicine, although it has the advantage that good images are supplied even with relatively low homogeneity of the magnetic field, so that this process would be especially well suited, inter alia, for simple installations from this point of view.

Accordingly it is the object of the invention to improve the process of the type described initially so that when using spin echo pulse sequences, no mirror images will arise.

This object is achieved according to the invention in that the phase position and, thus, the sense of rotation of the 180° pulses is reversed after every two pulses so that each pulse of the sequence is adjacent in time to one pulse of an identical, and one pulse of an opposite sense of rotation.

Accordingly, the invention consists of a modification of both, the known Carr-Purcell pulse sequence where the phase position of the 180° pulses is identical to that of the preceding 90° excitation pulse, and the known Carr-Purcell-Gill-Meiboom pulse sequence where the phase position of all 180° pulses is rotated by 90° relative to the 90° excitation pulse, but equal within the sequence of 180° pulses. Due to this surprisingly simple measure, namely to reverse the phase position within the sequence of 180° pulses after every two pulses, reflexion-free images are obtained by means of the 2DFT process, in spite of the use of a spin echo pulse sequence.

The invention will be explained and described below in more detail with reference to the diagrams shown in the drawing in which:

FIG. 1 shows a time diagram of the gradient fields and signals in a conventional 2DFT process when employing a Carr-Purcell-Gill-Meiboom pulse sequence;

FIGS. 2a–2d show phasor diagrams illustrating the spin moments rotated in the X-Y plane, when using the process according to FIG. 1;

Figure 3A:
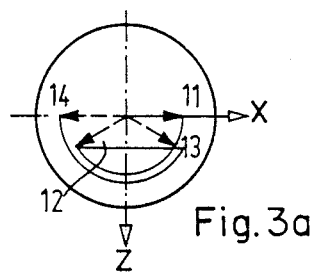
FIGS. 3a–3d show phasor diagrams of the spin moments shown in FIG. 2 in the X-Z plane.

As is well known, in NMR tomography a sample to be examined, especially a human body or part of the body, is exposed to a strong homogenous magnetic field $B_0$, whose direction is usually associated with the Z-axis of a rectangular system of coordinates. Due to the influence of the magnetic field, the magnetic spin moments of the atomic core in the sample are normally, i.e. without any additional external influence, aligned in the Z-direction. The information required to produce an image can however only be obtained from the HF signals, which are generated by the components perpendicular to Z of the spin moment which is rotating in the X,Y plane around the Z-direction. These signals are named core induction signals. Therefore, the spin moments in the areas to be imaged of the sample must be rotated out of the Z-direction, preferably by 90° into the X,Y plane, by irradiation of high frequency in a suitable manner.

For imaging a cross-section of the sample to be investigated, the spin moments must therefore be rotated within a selected section of the sample as competely as possible into the X,Y plane, whereas the spin moments outside the section must remain aligned as completely as possible in the Z-direction. This process is called selective excitation of the spin moments; the time interval within a tomographic process during which the selective excitation takes place is called the selection phase.

The spin moments rotated into the X,Y plane are exposed in the 2DFT process to the dephasing effect of the gradient fields designated as phase coding gradient and read gradient. Since the information required to form an image is obtained from the influence of this dephasing on the core induction signals to be observed, the selective excitation must be performed so that thereby the spin moments to be excited are as far as possible rotated *in phase* in the X,Y plane, i.e. so that they rotate without the influence of the phase coding gradient or of the read gradient as far as possible in the same phase around the Z-direction.

A known process for selective excitation which meets this condition consists in that the homogenous magnetic field $B_0$ has superimposed thereon a magnetic gradient field which is also aligned parallel to the Z-direction, whose strength alters however along a direction which is perpendicular to the cross-sectional plane chosen for the image. This gradient field is named the selection gradient. Under the influence of the adjacent magnetic fields, the Larmor frequency of the spin moments in the sample changes along the direction of the selection gradient. (The direction in which the magnetic field strength alters in the presence of a gradient field will hereinafter be described briefly as the direction of this gradient.) By irradiating of a narrow-band HF pulse, therefore, the spin moments within a section of the sample perpendicular to the direction of the selection gradient, whose thickness is defined by the band width of the HF pulse, can be rotated about an angle $\alpha$ out of the direction of the Z axis, preferably—by dimensioning the pulse correspondingly—about an angle of 90° into the X,Y plane. Hereinafter a pulse which rotates the spin moments by the angle $\alpha$ will be described as an $\alpha$ pulse. After the ending of the selective 90° pulse, according to the known process the direction of the selection gradient is reversed so as to effect rephasing of those spin moments within the section which were dephased during the period of the 90° pulse under the influence of the selection gradient. A further possibility for rephasing comprises the use of a 180° pulse, in the presence of an unaltered selection gradient. In both cases the selection gradient is switched off at the time rephasing is completed. This time represents the end of the selection phase; it is marked in the diagram of FIG. 1 as $t_1$. The complete rephasing of the spin moments at the time $t_1$ is connected with the appearance of a core induction signal in the form of a so-called spin echo 1.

However, the selection phase is not the subject of the invention. Therefore, it is not fully shown on the diagram of FIG. 1. Hereafter, it will only be assumed that during the selection phase the spin moments within the section to be imaged have been rotated as completely as possible into the X,Y plane, in the manner described above or in another way, so that they rotate in phase around the Z-direction at the time $t_1$.

The phase position of the spin moments within the X,Y plane is described in accordance with the general practice by means of a coordinate system rotating with the Larmor frequency of $B_0$ around the direction of the Z-axis. The directions in this system will be designated below as X,Y, and Z, of which the Z direction is fixed, while the X and Y directions rotate in the X,Y plane. (In a static coordinate system the directions X and Y represent the phase positions of a precession movement taking place at Larmor frequency around the direction of the Z-axis). Hereinafter the X-direction is defined by the assumption that the selective excitation has taken place due to a 90°, X-pulse. This is understood to mean a pulse which rotates the spin moments around the direction X by 90° so that at the time $t_1$ they point in the Y-direction of the rotating coordinate system. This phase position of the spin moments at time $t_1$ is shown in FIG. 2a at 9.

At the time $t_1$ the phase coding gradient $G_P$ is switched on, having a dephasing effect such that at its end at the time $t_2$, the phase position of certain spin moments has been rotated into the direction indicated by the arrow 2 (FIG. 2b). The 2DFT process is based on the fact that by variation of the duration or of the intensity of the phase coding gradient $G_P$ differing phase positions are adjusted which produce different intensities of the signals measured by the read gradient $G_L$, which after appropriate processing of said signals, makes possible the imaged representation of a cross-sectional plane of the sample.

Figure 3B:
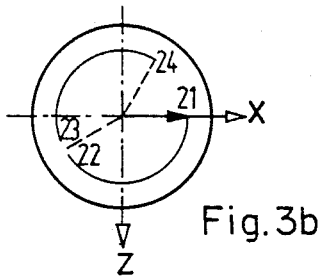
Figure 3C:
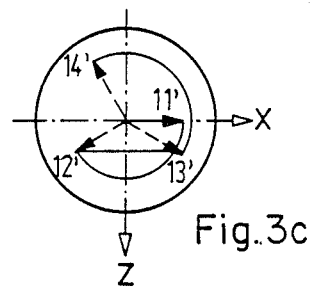
Figure 3D:
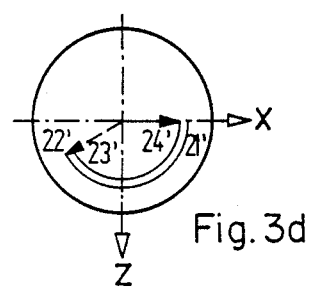

As is shown in FIG. 2b, the spin moment 2 can be broken down into a Y component 3 and an X component 4. With respect to these components, dephasing of the spin moments takes place until time $t_3$ of the first 180° pulse which dephasing is caused by the variation of the magnetic field due to the read gradient switched on at time $t_2$ and also to the nonhomogeneities of the field. The dephasing for the Y and the X components at time $t_3$ is shown in FIGS. 2c and 2d. The 180° pulse at time $t_3$ is used in the conventional manner to reverse the dephasing so that at a certain time after the 180° pulse 5, an echo signal 6 is generated. In the case of the embodiment shown the pulse 5 is assumed to be a 180° Y-pulse which produces a rotation of the spin moments by 180° around the Y-axis. To illustrate this rotation, the spin moments of FIGS. 2c and 2d are depicted in FIGS. 3a and 3b in their projection in the X,Z plane. The 180° pulse rotating around the Y-axis has the same effect on the Y component 3 of FIG. 2b as the pulse of a Carr-Purcell-Gill-Meiboom sequence. It is characteristic of this pulse sequence that not only are the phase errors compensated which are caused by differing Larmor frequencies as a result of magnetic field non-homogeneities, but that in the course of the pulse sequence those errors are also compensated which arise because due to the defective adjustment of the pulse length or to a local variation of the $H_1$ field strength, certain spin moments are in fact rotated by a "180° pulse" by a smaller or a larger angle than 180°. How this compensation is effected is shown in FIG. 3a. The too small rotation from 11 to 12 by the pulse 5 is compensated by the displacement of the starting point in 13, so that after the next 180° pulse 7 at the echo signal 8 (FIG. 1), the spin moment is again located in the X,Y plane (position 14). The behavior is different in the case of the X component 4 of FIG. 2b of the spin moment according to FIG. 3b. Here the rotation from position 21 to position 22 is followed by the equally too small rotation from pos. 23 to pos. 24, whereby the phase error is increased. The consequence of that is that when using a Carr-Purcell-Gill-Meiboom pulse sequence according to FIG. 1, the signal share arising from the X component completely disappears in a short time and only the signal share from the Y component remains. If a pulse sequence rotating around the X-axis were to be used, compensation with respect to the signal share emanating from the X component would occur, whereas the signal share emanating from the Y component would disappear. Another variant of the Carr-Purcell pulse sequence known from NMR spectroscopy consists in that the phase position of the 180° pulses is reversed after every pulse. When such a simply alternating pulse sequence rotating about the Y axis is employed, the signal portion emanating from the Y component disappears according to FIG. 3a, pos. 11' to 14', while according to FIG. 3d, pos. 21' to 24', the signal portion emanating from the X component is compensated. The opposite will be true again for a simply alternating pulse sequence rotating about the X axis.

Figure 4A:
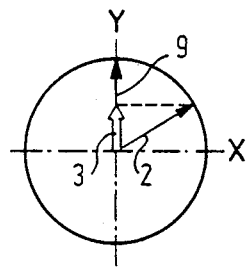
FIGS. 4a–4b show phasor diagrams to explain the occurrence of mirror images.
Figure 4B:
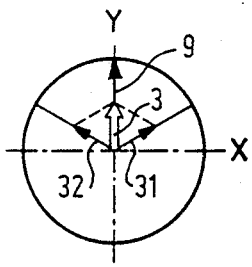

In the embodiment shown in FIG. 1 which corresponds to the prior art and which shows a spin echo pulse sequence (Carr-Purcell-Gill-Meiboom pulse sequence) it is therefore assumed that because of the ever present deviations from 180° of the angle of rotation, the signal share arising out of the X component disappears in the course of some echos. This causes a loss of information, and the sole residual signal share which came from the Y component will be interpreted as if at the time $t_2$, instead of the spin moment 2 with the correctly coded phase position (FIG. 4a), two spin moments 31, 32, each having half the strength of 2, were present which had resulted due to the original phase position under the phase coding gradient and whose resultant force is the Y component 3 (FIG. 4b). The components 31, 32 of the spin moment produce the mirror images which totally distort the actual cross-sectional image and therefore previously made the use of spin echo pulse sequences impossible when employing the 2DFT technology. In the same way mirror images also appear with the other known spin echo pulse sequences, in which the phase position of the 180° pulse remains the same or simply alternates.

Figure 5:
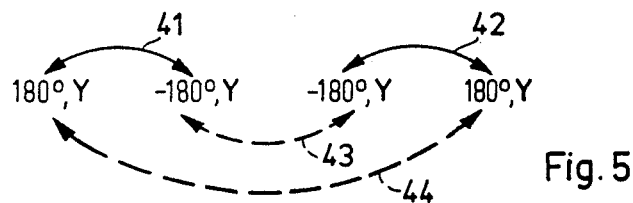
FIG. 5 shows a schematic to explain the compensation of rotational angle errors of the 180° pulses according to the process of the invention.

These relationships were not known and are by no means self-evident. On the contrary it required very intensive tests to arrive at an explanation of the mirror images. Because of the above interpretation of the origin of the mirror images, a process can now be described showing how to avoid these mirror images. This process consists in that the phase position of the 180° pulses is reversed after every second pulse (double alternating pulse sequence). In a double alternating pulse sequence (Example: +180°,Y ... −180°,Y ... −180°,Y ... +180°,Y ... etc., or: +180°,Y ... +180°, Y ... −180°,Y ... −180°,Y ... etc.) each pulse is adjacent in time to both an identical pulse and a pulse with opposite sign. This has the effect that, regardless of the axis on which the 180° pulses act, complete compensation of the errors generated by deviations from the rotary angle of 180° will take place after every four successive pulses, and this irrespective of the phase position of the spin moments produced by the phase coding gradient, as given at the time $t_2$. This is illustrated in FIG. 5 by way of the example of the double alternating pulse sequence +180°, Y ... −180°, Y ... −180°, Y ... +180°, Y ... etc., where the full-line arcs 41 and 42 indicate the compensation relative to the signal portions resulting from the X component by pulse pairs with different signs, while the dashed arcs 43 and 44 indicate the compensation relative to the signal portion resulting from the Y component by pulse pairs with different signs.

For clarity's sake, FIG. 1 and the specification have been related to an embodiment of the 2DFT process in which the three gradient fields $G_S$, $G_P$ and $G_L$ are generated one after the other, but in immediate succession. Other embodiments of the 2DFT process are, however, also imaginable and known. In particular, the phase coding gradient $G_P$ and the read gradient $G_L$ may be generated simultaneously, or else at least one of these two gradients may be switched on at a time when rephasing relative to the selection gradient $G_S$ has not been completed and the selection gradient is still applied. In this latter case, the spin echo 1 will be diminished or not observed at all. The process of the invention, i.e. the use of double alternating pulse sequences, is however independent of the selected embodiment of the 2DFT process.

We claim:

1. Process for the excitation of a sample for NMR tomography, in which the sample is exposed to a homogenous magnetic field and in addition to a selection gradient and is excited by a 90° selection pulse, whereafter the selection gradient is replaced by a phase coding gradient of limited time duration and a read gradient, the selection gradient, the phase coding gradient and the read gradient being mutually perpendicular to each other, and wherein finally the sample, after the ending of the phase coding gradient and with prevailing read gradient, is irradiated with a sequence of 180° pulses, whereby a plurality of core induction signals is generated in the form of so-called spin echos, characterized in that the phase position and, thus, the sense of rotation induced by the 180° pulses is reversed after every two pulses so that each pulse of the sequence is adjacent in time to one pulse inducing rotation in the same sense and one pulse inducing rotation in the opposite sense.

* * * * *